US006236054B1

(12) United States Patent
Barna et al.

(10) Patent No.: US 6,236,054 B1
(45) Date of Patent: May 22, 2001

(54) ION SOURCE FOR GENERATING IONS OF A GAS OR VAPOR

(76) Inventors: Arpád Barna, Szinyei Merse u. 5, H-1063 Budapest (HU); Dezsö Szigethy, Rákó u. 11, H-1121 Budapest (HU)

( * ) Notice: Subject to any disclaimer, the term of this patent is extended or adjusted under 35 U.S.C. 154(b) by 0 days.

(21) Appl. No.: 09/269,801

(22) PCT Filed: Sep. 27, 1996

(86) PCT No.: PCT/HU96/00054

§ 371 Date: Dec. 15, 1999

§ 102(e) Date: Dec. 15, 1999

(87) PCT Pub. No.: WO98/13851

PCT Pub. Date: Apr. 2, 1998

(51) Int. Cl.[7] .............................. H01J 49/10; H01J 27/02; H01J 37/30

(52) U.S. Cl. ................ 250/427; 250/423 R; 250/492.21; 250/492.2

(58) Field of Search ............................... 250/423 R, 427, 250/492.21, 492.2

(56) References Cited

U.S. PATENT DOCUMENTS 4,468,564 * 8/1984 Boyer et al. ......................... 250/427

FOREIGN PATENT DOCUMENTS 0 036 665 9/1981 (EP) .
0 267 481 5/1988 (EP) .

OTHER PUBLICATIONS

Shimokawa et al, “A Low–Energy Fast–Atom Source”, Nuclear Instruments & Methods in Physics Research/Section B, B33, vol. II, Jun. 1988, Nos. 1–4, pp. 867–870.

Alton, “Ion sources for accelerators in materials research”, Nuclear Instruments & Methods in Physics Research B, B 73, No. 2, Feb. 1993, pp. 221–288.

* cited by examiner

*Primary Examiner*—Jack Berman
*Assistant Examiner*—Nikita Wells
(74) *Attorney, Agent, or Firm*—Venable; Gabor J. Kelemen

(57) ABSTRACT

An ion source for generating ions of a gas or vapor, especially for thinning solid state samples, includes a housing, an arrangement for introducing the gas or vapor into the housing and an anode positioned within the housing. The anode has a rotationally symmetrical cavity which is open at both sides along the axis of the source. First and second electrooptical mirrors are disposed along the source axis and define therebetween a space in which the anode is positioned The mirrors produce an electrostatic field to cause electrons to oscillate between them. At least one of the mirrors is apertured for exit therethrough of a fraction of ions generated in the space. An electron generating arrangement is disposed at one side of the cavity externally of the space between the mirrors and further, an arrangement causes the electrons to move into the cavity.

10 Claims, 1 Drawing Sheet

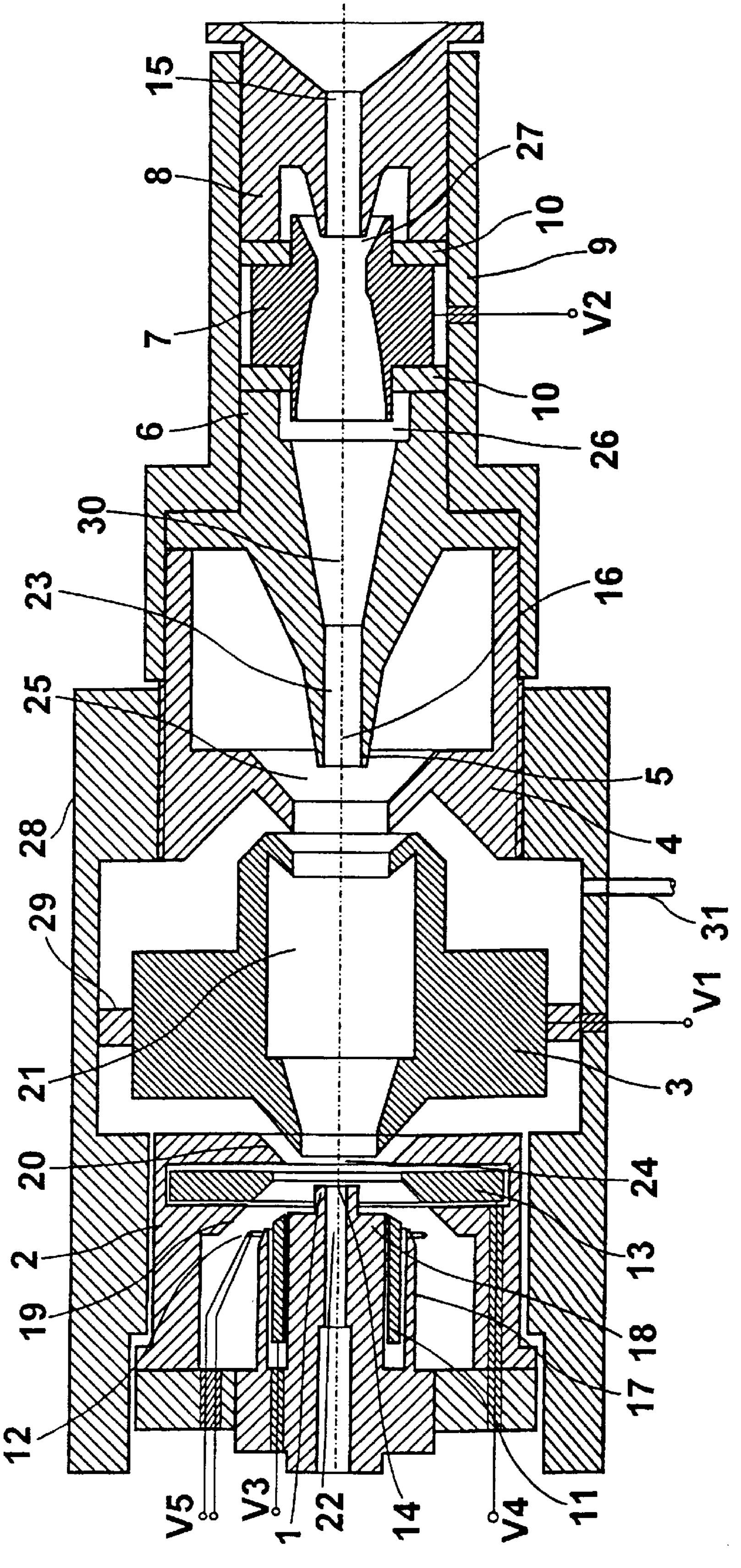
15
8
27
10
9
V2
7
10
6
26
30
23
16
25
5
28
4
29
31
V1
21
3
20
24
2
13
19
18
17
12
V5
V3
1
22
14
V4
11

ION SOURCE FOR GENERATING IONS OF A GAS OR VAPOR

TECHNICAL FIELD

The invention relates to an ion source for generating ions of a gas or vapour which can be used for ion beam processing of solid state samples. The ion source according to the invention can produce a low diameter and high current density ion beam with relatively low voltage.

BACKGROUND ART

Ion beam milling is widely used in the ion beam thinning units and analytical devices of structural characterization and in manufacturing technologies applying layered structures. Different ion sources have been developed according to requirements. In the field of structural research gas ion sources are used for preparation of samples for electron microscopy, e.g. ion beam thinning, for cleaning of surfaces, e.g. tunnel electron microscopy, and for investigation of buried layers in chemical analysis, e.g. Auger electron spectroscopy or secondary ion mass spectroscopy. The target is placed in a vacuum chamber the pressure of which can not exceed the value of $10^{-5}$ to $10^{-2}$. Pa in accordance with requirements of the thinning or the measurement.

Up to now, cold cathode gas ion sources have been generally used in ion beam thinning apparatus, while hot cathode ones in analytical instruments.

The simplest form of a cold cathode ion source is the cavity type dual electrode version. The advantage of such source is its compact and simple structure. However, it has some disadvantages as well. High gas pressure of 40–50 Pa should be applied inside the source to generate ion plasma and a high voltage of 2–15 keV is needed to obtain a proper ion beam. A vacuum pump with a high pumping speed of 2000–5000 l/s is necessary to achieve a low background pressure in the vacuum chamber of the thinning unit. The divergence angle of the beam is high (10–20°) at the exit bore of the source due to a considerable scattering within the ion source. An additional disadvantage of that source is that most of the accelerated ions are neutralized close to the exit bore by secondary electrons induced by ion collisions. Although the high speed neutral gas beam can be used for etching samples, but it can not be deflected or shaped further by electric or magnetic field.

In Penning type gas ion sources the accelerating ions induced by ion collision from a cold cathode and travelling towards an auxiliary anode are forced to follow a spiral path. At a lower pressure even the increased mean free path is enough to result in ionizing collisions and avalanche process to generate the ion plasma. Typical values of the gas pressure in the ionization chamber of the source are in the range of 0.1–1 Pa. An extraction electrode accelerates the ions generated in the ionization chamber to the required energy and additional electrodes focus and scan the ion beam. One of the disadvantages of this type of source is its complicated construction. Since the target is at ground potential, the ionization chamber should be connected to a relatively high potential in accordance with the needed ion energy. This causes problems in the insulation, especially if cooling is required. Another disadvantage of the source is its large size which allows to place it in a fixed position only within the vacuum chamber.

The mean free path of the electrons and thus the ionization probability can also be enhanced by applying electrostatic field to force the electrons leaving the cold cathode to oscillate. These are the so called electrostatic electron-oscillating ion sources as described e.g. in EP-B1 0 267 481. This cold cathode ion source provides an ion current density with an order of magnitude higher, has a simple construction, its cooling circuit can be held at ground potential, the divergence angle of the ion beam at the exit bore is smaller than 10 even without any further focusing, while the required gas pressure within the ion source is about 0.1 Pa as in the case of the Penning type sources mentioned.

Hot cathode ion sources are primarily used in analytical instruments for surface cleaning and removing surface layers by sputtering. The ions are generated in a separate chamber. The hot cathode is situated in that chamber together with an auxiliary anode which is usually a grid. The chamber is connected to an appropriate potential determined by the ion energy. The system of further electrodes used to accelerate, shape and scan the ion beam is essentially identical with the arrangement of the Penning type sources. The value of the pressure needed inside the source is $10^{-3}$–$10^{-2}$ Pa, while the lower pressure in the vacuum chamber is ensured by differential pumping. Ion current of a few $\mu$A can be gained as a maximum from said ion sources. These sources should be fixed to the vacuum chamber due to their large size.

There are gas ion sources which combine a hot cathode with magnetic field. Such duo-plasmotron type gas ion sources show favorable parameters as to the maximum current density and the needed gas pressure, but their construction is complicated, further their usage and maintenance are not easy. The sources should be fixed to the vacuum chamber due to their large size.

The most efficient sputtering can be reached by 10 keV ions. The high energy bombardment causes damaging of the target material and usually a 10–15 nm thick damaged layer is formed on the surface of the sample. This damaged layer hinders investigations of the ion beam thinned samples also in analytical spectroscopy. The thickness of the damaged layer can be decreased by lowering either the angle of beam incidence or the energy. However, the sputtering rate decreases due to the low angle and low energy. In such a case the solid state chemical reactions, e.g. carbon deposition from hydrocarbons of the residual gas, taking place on the surface of the sample can disturb the observations.

Both at ion beam thinning and at analytical investigations of buried layers it is favorable to start the etching at higher angles of beam incidence and at higher energy of bombardment which is lowered when a certain depth of etching is reached. As the position of the surface of the target is determined by the analytical arrangement, the ion source must be able to be tilted to adjust the appropriate angle of beam incidence which requires an ion source of small size. In the case of low energy ion etching, the sputtering rate is drastically decreased due to the dropped ion current generated by the lowered accelerating potential of the source.

In the case of cold cathode guns, there is a lower limit of the accelerating voltage which also determines the ion energy as 1.5–2 kV should be applied at least to gain a well collimated beam.

In the cold cathode ion source according to EP-B1 0 267 481 mentioned above there is an anode with a central bore and two symmetrical hollow space cold cathodes. Both of the hollow space cathodes have contractions to one side of the anode, while there are conical parts of the cathode at the another side protruding towards the anode. The source needs 1.5–2 kV anode potential as a minimum to generate ion beam. With the above parameters the value of the ion current is 4–6 $\mu$A and the required gas pressure is about 0.5 Pa.

DISCLOSURE OF THE INVENTION

It is an object of the present invention to develop a gas ion source working in a wider energy range at a lower gas pressure and with a relatively high ion current.

It has been discovered that the avalanche process of an ion plasma, which is gained from a cold cathode source having tele-optical electrostatic lenses arranged in mirror symmetry, can be generated and maintained at lower gas pressure and anode voltage by applying electrons gained from a hot cathode and by forcing them to follow an appropriate path.

Thus, the invention is an ion source for generating ions of a gas or vapour, especially for thinning solid state samples, comprising a housing, means for introducing said gas or vapour into said housing, an anode positioned within said housing, said anode having a rotationally symmetrical cavity being open at both sides along the axis of the source, first and second electrooptical mirror means disposed along said axis and defining therebetween a space within which said anode is positioned, said first and second electrooptical mirror means creating an electrostatic field so as to cause electrons to oscillate between them, wherein at least one of said first and second electrooptical mirror means being apertured for exit therethrough of a fraction of ions generated in said space. The ion source according to the invention is characterized by comprising means for generating electrons disposed outside said cavity at one of said sides of said cavity, and means for causing said generated electrons to move into said cavity.

In a preferred embodiment of the invention said means for generating electrons are a hot cathode positioned in a plane transverse to the axis of the source. Preferably, the hot cathode is a ring shaped body being rotationally symmetrical to said axis. Thereby, the present invention is a combined hot-cold cathode ion source.

It is of advantage that each of the first and second electrooptical mirror means comprises a rotationally symmetrical cold cathode surrounded by a Wehnelt cylinder, and said means for causing said electrons to move into the cavity of the anode comprise two rotationally symmetrical auxiliary electrodes positioned between the cold cathode and the Wehnelt cylinder in the first electrooptical mirror means. The electric field causing to move the electrons emitted by the hot cathode into the cavity of the anode may be improved if the hot cathode is disposed between the two auxiliary electrodes, and each of the auxiliary elecrodes is placed between two further rotationally symmetrical electrodes.

The ion source according to the invention may be embodied in such way that the second electrooptical mirror means has an aperture for exit therethrough of a first fraction of the ions towards a work space, while the first electrooptical mirror means has another aperture for exit therethrough of a second fraction of the ions into an ion current measuring device, which is preferably a Faraday cage.

The ion source according to the invention may preferably comprise an electrostatic lens having an axis in alignment with the axis of the source and positioned adjacent the second electrooptical mirror means, said electrostatic lens comprising three electrodes disposed axially away from each other. It may be that the electrostatic lens and the second electrooptical mirror means form a changeable unit mounted to said housing.

BRIEF DESCRIPTION OF DRAWING

The invention will be further described with reference to the attached drawing which shows a diagrammatic sectional view of an embodiment of the ion source according to the invention.

MODES FOR CARRYING OUT THE INVENTION

In the FIGURE, the ion source has a metal housing 28 enclosing two cold cathodes 1 and 5, an anode 3 between the cold cathodes 1 and 5, two Wehnelt cylinders 2 and 4 surrounding the cold cathodes 1 and 5, respectively, two auxiliary electrodes 11 and 13 positioned between the cold cathode 1 and the Wehnelt cylinder 2, and a hot cathode 12 positioned between the two auxiliary electrodes 11 and 13. The 28 housing has a gas inlet 31 and a pipe of a cooler, which is not shown in the FIGURE. The gas supplied may be e.g. hydrogen or argon or iodine vapour. There is a Faraday cage not shown to measure the ion current exiting through a cavity 22 of the cold cathode 1 mounted to the back support block of the cold cathode 1.

The housing 28 is at a potential of zero volts (ground) and is electrically connected to the first and second cold cathodes 1, 5 of the facing electrode system in a rotationally symmetrical arrangement. The common anode 3 with an inner cavity 21 delimited by rotationally symmetrical surfaces is situated between the cold cathodes 1 and 5. The anode 3 is insulated by insulating support 29 from the housing 28, while it is electrically connected to the high voltage plug supplying a potential V1. Cold cathode 1 is surrounded by the Wehnelt cylinder 2, while cold cathode 5 is surrounded by the Wehnelt cylinder 4, and the Wehnelt cylinders 2 and 4 are also electrically connected to the housing 28. The cold cathode 1 together with the Wehnelt cylinder 2 constitute a first electrooptical mirror and the cold cathode 5 together with the Wehnelt cylinder 4 constitute a second electrooptical mirror for the electrons between them. The auxiliary electrodes 11 and 13 are mounted with insulators not shown in the figure and the hot cathode 12 is placed around the first cold cathode 1 which is situated opposite to a smaller diameter conical end of the anode 3. The auxiliary electrodes 11 and 13 are connected to auxiliary voltage plugs supplying potentials V3 and V4 and the hot cathode 12 is connected to a heating voltage plug at potential V5. The potential values may be the following: V1=+50–10000 V, V3=V4=+40–250 V and V5=+4–15 V.

An electrostatic, open focusing lens, which is coaxial with the common axis 30 of the ion source, is connected to the outer side of the second cold cathode 5 which lens is composed of a first electrode 6 connected electrically to the second cold cathode 5 and of a second electrode 7 which is separated from the first electrode 6 by an insulating gap 26 and of a third electrode 8 separated from the second electrode 7 by an insulating gap 27. The first electrode 6 and the third electrode 8 are electrically connected to the housing 28, while the middle second electrode 7 is mounted with insulators 10 and connected electrically to a second high voltage plug supplying a potential V2 the value of which may be 0.6 V1. The hot cathode 12 can not be exposed to the sputtering effect of the high energy ions generated within the anode cavity 21 because its lifetime would be decreased dramatically. Both computer simulation and experiments have shown that the hot cathode 12 is not bombarded by high energy ions in the given arrangement.

The electrons leaving the ring shaped hot cathode 12 have to be forced to follow a path close to the symmetry axis 30 before they would enter the cavity 21 of the anode 3 in order to make the electron oscillation efficient. Thermal electrons that leave the hot cathode 12 in the plane of the meridian in a wide angular range are focused to the cavity 21 of the anode 3 by the auxiliary electrodes 11, 13 and by the potential field which is generated between the Wehnelt cylinder 2 and the anode 3. The electrons are reflected by the cold cathodes 1 and 5 that are situated at the two opposite ends of the anode 3, thus, the electrons are oscillating along the axis of the anode and efficiently ionizing the gas molecules being in the space between the two cold cathodes 1, 5.

The operation of the ion source according to the present invention is described as follows.

In the ion source ions are generated by collision with electrons and are accelerated towards the cold cathodes 1, 5 by the high voltage between the anode 3 and the cold cathodes 1, 5. The secondary electrons generated by ions impinging the cold cathodes 1, 5 are accelerated towards the anode 3 by the anode-cathode voltage, and they ionize the gas molecules in anode cavity 21 by collisions. New secondary electrons are generated by the produced ions when they impinge into one of the cold cathodes 1, 5. The ion plasma is generated and maintained by the above avalanche process in the anode cavity 21. The high voltage between anode 3 and the first and second cold cathodes 1, 5 accelerates the ions being present in the ion plasma, and a smaller fraction of the ions leaves the ion source through the cathode cavity 22 and enters the Faraday cage not shown in the figure, and a greater fraction of the ions leaves the ion source through the cathode cavity 23 as an ion beam and passes the focusing electrooptical lens towards a work space. In the present invention, which is a combined hot-cold cathode ion source, the above avalanche process can be generated at a anode-cathode voltage as low as 50 V.

The electrons leaving the hot cathode 12 are oscillating in the accelerating, decelerating and mirror potential fields of auxiliary electrodes 11 and 13, cold cathodes 1 and 5, anode 3 and Wehnelt cylinders 2 and 4, respectively. Most of the electron trajectories end on one of the positive electrodes. If there are gas molecules in the inner space of the ion source, i.e. within the anode cavity 21 or inner spaces 24 and 25, the electrons generated by hot cathode 12 and accelerated by the anode potential VI ionize them by collisions and ignite the above described avalanche process. An ion plasma is formed due to the above process in the anode cavity 21 from which ions accelerated by the potential difference between anode 3 and cold cathodes 1 and 5 cross exit apertures 14 and 16, and are focused by the electrooptical lens and finally leave the ion source through an exit bore 15. The energy and the focal point of the ion beam are determined by the values and ratio of anode potential V1 and focusing potential V2. A scanning ion source can be realized in a per se known way by deflecting electrodes, not shown in the figure, which are placed outside the exit bore 15.

In a preferred embodiment the anode 3 is made of stainless steel or copper, the cold cathodes 1 and 5 are made of aluminium and the hot cathode 12 is made of tungsten.

The ion source according to the present invention possesses the following advantageous features in contrast to the previously known constructions:

- the ion source ignites at a voltage as low as 50 V;
- the energy of the ions can be set in a wide range from 50 eV to 10 keV;
- ion currents higher by an order of magnitude can be gained from the ion source as compared to any other hot cathode electrostatic ion source being present on the market when the same ion energy i.e. anode potential is used;

- the ion beam can be focused in a wide range, in a distance of 5–100 mm from the ion beam exit of the ion source;
- as the hot cathode and the auxiliary electrodes are close to the ground potential, requirements for high voltage insulating are not so rigid both from the point of view of the ion source and the electrical power supply;
- the ion source has a small size, e.g. 30–50 mm in diameter and 60–90 mm in length;
- the cooling of the ion source can be realized easily through the metallic housing of the source which is at ground potential.

What is claimed is:

1. An ion source for generating ions of a gas of vapour, especially for thining solid state samples, comprising a housing, means for introducing said gas or vapour into said housing, an anode positioned within said housing, said anode having a rotationally symmetrical cavity being open at both sides along the axis of the source, first and second electrooptical mirror means disposed along said axis and defining therebetween a space within which said anode is positioned, said first and second electrooptical mirror means creating an electrostatic field so as to cause electrons to oscillate between them, wherein at least one of said first and second electrooptical mirror means being apertured for exit therethrough of a fraction of ions generated in said space, further comprising means for generating electrons disposed outside said cavity at one of said sides of said cavity, and means for causing said generated electrons to move into said cavity.

2. The ion source according to claim 1, wherein said means for generating electrons are a hot cathode positioned in a plane transverse to said axis.

3. The ion source according to claim 2, wherein said hot cathode is a ring shaped body being rotationally symmetrical to said axis.

4. The ion source according to claim 2, wherein each of said first and second electrooptical mirror means comprises a rotationally symmetrical cold cathode surrounded by a Wehnelt cylinder.

5. The ion source according to claim 4, wherein said means for causing said electrons to move into said cavity comprise two rotationally symmetrical auxiliary electrodes positioned between said cold cathode and said Wehnelt cylinder in said first electrooptical mirror means.

6. The ion source according to claim 5, wherein said hot cathode is disposed between said two auxiliary electrodes.

7. The ion source according to claim 6, wherein each of said auxiliary electrodes is placed between two further rotationally symmetrical electrodes.

8. The ion source according to claim 4, wherein said second electrooptical mirror means has an aperture for exit therethrough of a first fraction of said ions towards a work space, while said first electrooptical mirror means has another aperture for exit therethrough of a second fraction of said ions into an ion current measuring device.

9. The ion source according to claim 4, further comprising an electrostatic lens having an axis in alignment with said axis of the source and positioned adjacent said second electrooptical mirror means, said electrostatic lens comprising three electrodes disposed axially away from each other.

10. The ion source according to claim 9, wherein said electrostatic lens and said second electrooptical mirror means form a changeable unit mounted to said housing.

* * * * *